United States Patent
Ogasawara et al.

(10) Patent No.: US 7,662,646 B2
(45) Date of Patent: Feb. 16, 2010

(54) PLASMA PROCESSING METHOD AND PLASMA PROCESSING APPARATUS FOR PERFORMING ACCURATE END POINT DETECTION

(75) Inventors: Kosuke Ogasawara, Nirasaki (JP); Susumu Saito, Nirasaki (JP); Syuji Nozawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 270 days.

(21) Appl. No.: 11/687,428

(22) Filed: Mar. 16, 2007

(65) Prior Publication Data

US 2008/0070327 A1    Mar. 20, 2008

Related U.S. Application Data

(60) Provisional application No. 60/785,996, filed on Mar. 27, 2006.

(30) Foreign Application Priority Data

Mar. 17, 2006    (JP) ............................. 2006-075308

(51) Int. Cl.
    H01L 21/00    (2006.01)
(52) U.S. Cl. .................. 438/9; 438/714; 216/59
(58) Field of Classification Search ............... 438/8, 438/9, 706, 710, 712, 714; 216/59, 60
    See application file for complete search history.

(56) References Cited

U.S. PATENT DOCUMENTS

| | | | | |
|---|---|---|---|---|
| 5,658,418 | A * | 8/1997 | Coronel et al. | 156/345.25 |
| 6,449,038 | B1 * | 9/2002 | Stolze | 356/316 |
| 6,541,388 | B1 * | 4/2003 | Saito | 438/712 |
| 2003/0056899 | A1 * | 3/2003 | Hanazaki | 156/345.25 |
| 2005/0020073 | A1 * | 1/2005 | Perry | 438/689 |
| 2005/0029228 | A1 | 2/2005 | Nozawa et al. | |
| 2005/0143952 | A1 * | 6/2005 | Tomoyasu et al. | 702/181 |
| 2007/0229845 | A1 * | 10/2007 | Usui et al. | 356/503 |

FOREIGN PATENT DOCUMENTS

JP    2001-217227    8/2001

* cited by examiner

*Primary Examiner*—Kin-Chan Chen
(74) *Attorney, Agent, or Firm*—Oblon, Spivak, McClelland, Maier & Neustadt, L.L.P.

(57) ABSTRACT

In a plasma processing method, a correlation between substrate type data and optical data is obtained by using a multivariate analysis; substrate type data is obtained from optical data based on the correlation when initiating a plasma processing; and a substrate type is determined by using the obtained substrate type data. Further, a setting data set corresponding to the determined substrate type is selected from setting data sets, each for detecting a plasma processing end point of the plasma processing, each of the setting data sets being stored in advance in a data storage unit; an end point of the plasma processing is detected based on the selected setting data set; and the plasma processing is terminated at the detected end point.

14 Claims, 12 Drawing Sheets

FIG.4

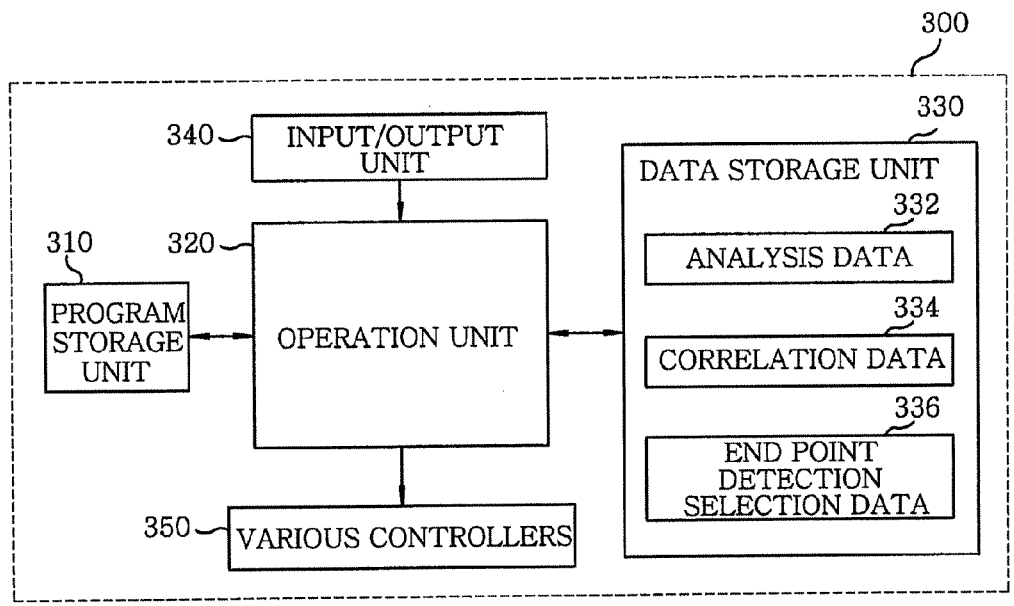

- 340 INPUT/OUTPUT UNIT
- 300
- 330 DATA STORAGE UNIT
- 332 ANALYSIS DATA
- 334 CORRELATION DATA
- 336 END POINT DETECTION SELECTION DATA
- 310 PROGRAM STORAGE UNIT
- 320 OPERATION UNIT
- 350 VARIOUS CONTROLLERS

FIG.5

| ANALYSIS DATA 332 ||||
|---|---|---|---|
| WAFER | WAFER TYPE | WAFER TYPE DATA (Y) | OPTICAL SPECTRUM DATA (X) |
| W1 | A | 0 | $\lambda a_{11}, \lambda a_{12}, \cdots \lambda a_{1k}$ |
| W2 | A | 0 | $\lambda a_{21}, \lambda a_{22}, \cdots \lambda a_{2k}$ |
| W3 | A | 0 | $\lambda a_{31}, \lambda a_{32}, \cdots \lambda a_{3k}$ |
| W4 | B | 1 | $\lambda b_{11}, \lambda b_{12}, \cdots \lambda b_{1k}$ |
| W5 | B | 1 | $\lambda b_{21}, \lambda b_{22}, \cdots \lambda b_{2k}$ |
| W6 | B | 1 | $\lambda b_{31}, \lambda b_{32}, \cdots \lambda b_{3k}$ |

| END POINT DETECTION SELECTION DATA | |
|---|---|
| WAFER TYPE | END POINT DETECTION SETTING DATA |
| A | Da |
| B | Db |

336

| END POINT DETECTION SELECTION DATA ||
|---|---|
| WAFER TYPE | END POINT DETECTION SETTING DATA |
| A | RECIPE Ra |
| B | RECIPE Rb |

| FILM THICKNESS DATA OF RECIPE Ra ||
|---|---|
| OPTICAL SPECTRUM DATA | FILM THICKNESS (nm) |
| $\lambda a_{11}, \lambda a_{12}, \cdots \lambda a_{1m}$ | T1 |
| $\lambda a_{21}, \lambda a_{22}, \cdots \lambda a_{2m}$ | T2 |
| $\lambda a_{31}, \lambda a_{32}, \cdots \lambda a_{3m}$ | T3 |
| $\lambda a_{41}, \lambda a_{42}, \cdots \lambda a_{4m}$ | T4 |
| $\lambda a_{51}, \lambda a_{52}, \cdots \lambda a_{5m}$ | T5 |
| ⋮ | ⋮ |

FIG. 16B

| FILM THICKNESS DATA OF RECIPE Rb ||
|---|---|
| OPTICAL SPECTRUM DATA | FILM THICKNESS (nm) |
| $\lambda b_{11}, \lambda b_{12}, \cdots \lambda b_{1n}$ | T1 |
| $\lambda b_{21}, \lambda b_{22}, \cdots \lambda b_{2n}$ | T2 |
| $\lambda b_{31}, \lambda b_{32}, \cdots \lambda b_{3n}$ | T3 |
| $\lambda b_{41}, \lambda b_{42}, \cdots \lambda b_{4n}$ | T4 |
| $\lambda b_{51}, \lambda b_{52}, \cdots \lambda b_{5n}$ | T5 |
| ⋮ | ⋮ |

FIG.17

| END POINT DETECTION SELECTION DATA | |
|---|---|
| WAFER TYPE | END POINT DETECTION SETTING DATA |
| A | METHOD Qa |
| B | METHOD Qb |

336

FIG. 19A
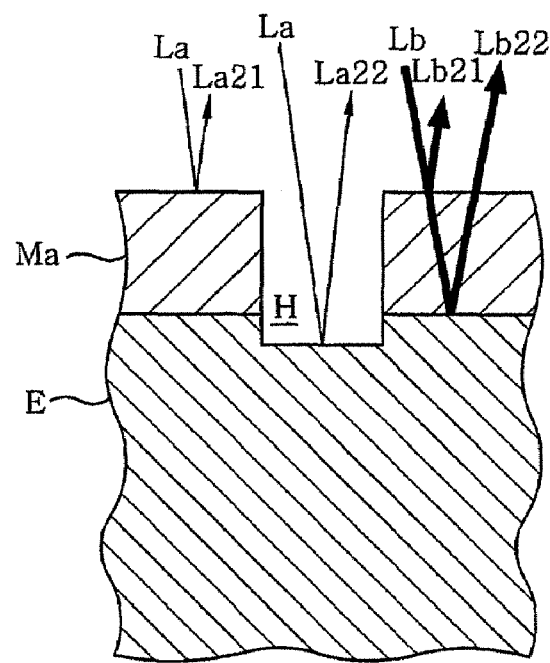
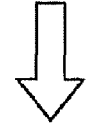
FIG. 19B
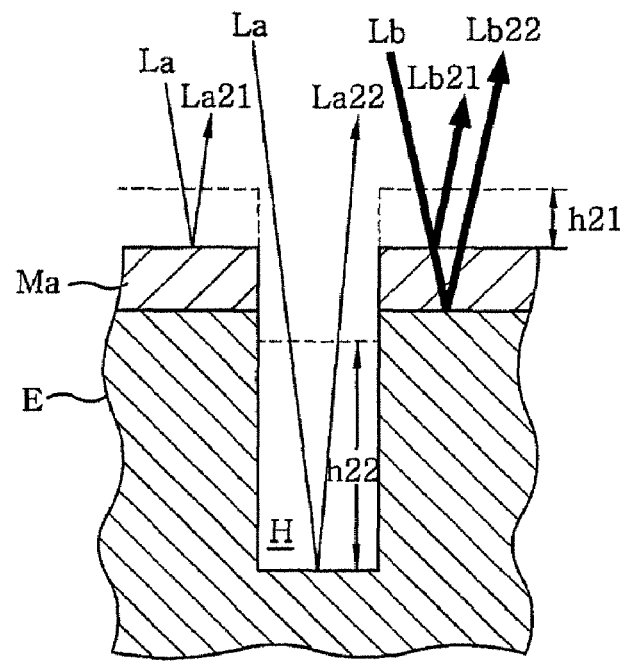

PLASMA PROCESSING METHOD AND PLASMA PROCESSING APPARATUS FOR PERFORMING ACCURATE END POINT DETECTION

FIELD OF THE INVENTION

The present invention relates to plasma processing method and plasma processing apparatus for performing plasma processing on a substrate such as a semiconductor wafer or a liquid crystal substrate.

BACKGROUND OF THE INVENTION

Plasma processing of a substrate (for example, etching, film forming process, etc.) has been widely applied in semiconductor manufacturing processes and Liquid Crystal Display (LCD) substrate manufacturing processes. Plasma processing apparatus used for such plasma processing includes an upper electrode and a lower electrode disposed parallel to each other in a processing chamber, allows a substrate, for example, a semiconductor wafer (hereinafter simply referred to as a "wafer"), to be mounted on the lower electrode, generates the plasma of processing gas by applying high-frequency power between the upper and lower electrodes, and etches a film using, for example, a patterned mask.

In such plasma etching, the detection of the end point of the processing using optical data that is obtained at the time of performing the plasma etching is known. For example, it is widely known that a light-emitting spectrum of gas generated by etching is detected as optical data, and the time at which a specific wavelength has been changed is detected as the end point of the etching. Furthermore, a method in which, when light having a specific wavelength is irradiated onto a substrate, the interference light (interference waves) of lights reflected from the boundary surface between a film to be etched and a mask, and from the surface of the mask, is detected as optical data. The etching rate or the film thickness is calculated based on the interference light, and the time at which the desired etching rate or the desired film thickness is achieved is detected as the end point of etching (for examples, see Patent Documents 1 and 2). Patent Document 2 discloses a scheme of calculating an etching rate in a mask having high light transmittance by irradiating two types of light having different wavelengths onto a wafer from a light source in consideration of the light transmittance of the mask.

(Patent Document 1)
Japanese Unexamined Patent Publication No. 2001-217227
(Patent Document 2)
Japanese Unexamined Patent Publication No. 2004-363367

Meanwhile, as semiconductor devices have become diversified recently, the case where plasma processing is performed on wafers having, for example, different types of mask patterns (having different aperture ratios) disposed in the same processing chamber is arising more frequently.

However, in the prior art, in the case where plasma processing was performed on such wafers, the end point of the plasma processing was detected without considering the type of mask pattern, so that experiments carried out by the inventor of the present invention, etc. revealed that erroneous detection of the end point occurred according to the type of mask pattern, even though the material of the mask was the same, with the result that the end point could not be detected accurately. That is, when the type of mask pattern is varied, the characteristics of optical data obtained in the plasma processing vary. Therefore, it could be seen that, when the end point of the plasma processing is detected based on such optical data, erroneous detection of the end point occurs according to the type of mask pattern, and the end point cannot be detected accurately.

In this case, although it is possible for an operator to change the end point detection method of the plasma processing apparatus for each wafer having a different type of mask pattern, that is, for each type of wafer, and then to perform processing, it takes a lot of time to check the type of wafer whenever wafer processing is performed and change the end point detection method each time, and thus throughput is decreased. This problem is not necessarily limited to the case where the type of mask pattern varies, but also occurs in the case where, for example, the type of material of a mask or the type of quality of a film varies.

SUMMARY OF THE INVENTION

It is, therefore, an object of the present invention to provide a plasma processing method, etc. that are capable of automatically determining the type of substrate, automatically selecting end point detection setting according to the determined type of substrate, and performing accurate end point detection regardless of the type of substrate based on the selected end point detection setting.

In accordance with one aspect of the present invention, there is provided a plasma processing method for generating a plasma of a processing gas by applying a high frequency power to an electrode provided in a processing chamber and processing a substrate using the plasma, the plasma processing method including: an analysis step of obtaining, by using a multivariate analysis, a correlation between substrate type data set corresponding to a plurality of substrate types and optical data to be detected by an optical data detection unit when plasma processing the substrate; a determining step of obtaining, based on the correlation obtained in the analysis step, substrate type data from optical data detected by the optical data detection unit when initiating a plasma processing on the substrate, and determining a substrate type of the substrate by using the obtained substrate type data; a selection step of selecting a setting data set corresponding to the substrate type determined in the determining step from setting data sets, each for detecting a plasma processing end point, each of the setting data sets corresponding to one of the substrate types and being stored in advance in a data storage unit; an end point detection step of detecting an end point of the plasma processing based on the setting data set selected in the selection step; and a termination step of terminating the plasma processing at the end point detected in the end point detection step.

In accordance with another aspect of the present invention, there is provided a plasma processing apparatus for generating a plasma of a processing gas by applying a high frequency power to an electrode provided in a processing chamber and processing a substrate using the plasma, the plasma processing apparatus including: an optical data detection unit for detecting optical data when plasma processing the substrate; a data storage unit for storing correlation data representing a correlation between substrate type data corresponding to a plurality of substrate types and optical data to be detected by the optical data detection unit, and end point detection setting data sets, each for detecting a plasma processing end point, each of the end point detection setting data sets corresponding to one of the substrate types; and a control unit for obtaining, based on the correlation data, substrate type data from optical data detected by the optical data detection unit when initiating a plasma processing, determining a substrate type based on the obtained substrate type data, selecting an end point detection setting data set corresponding to the determined substrate type from end point detection setting data sets stored in the data storage unit, and detecting an end point of the plasma processing based on the selected end point detection setting data set when processing the substrate using the plasma in the processing chamber.

In accordance with the method or apparatus of the present invention, the type of substrate can be automatically determined when the plasma processing of the substrate starts, and end point detection setting depending on the determined type of substrate can be automatically selected. Accordingly, accurate end point detection can be performed regardless of substrate type.

It is preferable that the optical data detection unit includes a light source for irradiating a light onto the substrate, and an optical detection unit for detecting optical spectrum data of a reflected light, the reflected light being obtained when the light irradiated from the light source is reflected from the substrate. If the type of substrate varies, the characteristics of optical spectrum data of the reflected light from the substrate are different. Accordingly, the type of the substrate can be determined using, for example, the optical spectrum data.

It is preferable that the optical data for determining the substrate type is optical spectrum data detected by the optical data detection unit in a predetermined time after initiating the plasma processing on the substrate. Accordingly, the type of substrate can be determined at an early stage immediately after initiating the plasma processing.

It is preferable that each of the substrate type is classified based on a type of a mask formed on a film to be processed as an object to be plasma-processed, and the end point detection step includes detecting a film thickness of the film to be processed on the substrate based on the optical spectrum data detected by the optical data detection unit at a predetermined time while processing the substrate, and determining a time when the film thickness reaches a predetermined film thickness as the end point of the plasma processing. Accordingly, the film thickness can be determined based on the optical spectrum data. As a result, not only the type of substrate, but also the film thickness of the film to be processed can be determined based on the optical spectrum data.

It is preferable that each of the setting data sets is an end point detection method or an end point detection recipe corresponding to one of the substrate types. Furthermore, a partial least squares method is used as the multivariate analysis in the analysis step.

In accordance with another aspect of the present invention, there is provided a plasma processing method for generating a plasma of a processing gas by applying a high frequency power to an electrode provided in a processing chamber and processing a substrate using the plasma, the plasma processing method including: an analysis step of obtaining, by using a multivariate analysis, a correlation between substrate type data set corresponding to a plurality of substrate types classified based on a type of a mask pattern formed on a film to be processed on the substrate and optical data to be detected by an optical data detection unit when plasma processing on the substrate; a determining step of obtaining, based on the correlation obtained in the analysis step, substrate type data from optical data detected by the optical data detection unit when initiating a plasma processing on the substrate, and determining a substrate type of the substrate by using the obtained substrate type data; a selection step of selecting a recipe setting data set corresponding to the substrate type determined in the determining step from recipe setting data sets, each for detecting a plasma processing end point, each of the recipe setting data sets corresponding to one of the substrate types and being stored in advance in a data storage unit; an end point detection step of detecting an end point of the plasma processing based on the recipe setting data set selected in the selection step; and a termination step of terminating the plasma processing at the end point detected in the end point detection step.

It is preferable that the optical data detection unit includes a light source for irradiating a light onto the substrate, and an optical detection unit for detecting optical spectrum data of a reflected light, the reflected light being obtained when light irradiated from the light source is reflected from the substrate. Furthermore, each of the substrate type is classified based on an aperture ratio within a region in a mask on the substrate.

It is preferable that each of the recipe setting data sets corresponds to one of film thickness data sets, each representing a correlation between the optical data and a film thickness, and the selection step includes selecting film thickness data corresponding to the substrate type determined in the determining step, and the end point detection step includes detecting, based on the film thickness data selected in the selection step, a film thickness of the film to be processed on the substrate from the optical spectrum data detected by the optical data detection unit at a predetermined time while processing the substrate, and determining a time when the film thickness reaches a predetermined film thickness as the end point of the plasma processing.

If the type of mask pattern on a substrate (for example, the aperture ratio within a specific region) varies, the characteristics of optical spectrum data reflected from the substrate vary. For this reason, in the case where end point detection is performed using the optical spectrum data, end point detection can be accurately performed regardless of the type of mask pattern by performing end point detection according to the type of the mask pattern.

In accordance with another aspect of the present invention, there is provided a plasma processing method for generating a plasma of a processing gas by applying a high frequency power to an electrode provided in a processing chamber and processing a substrate using the plasma, the plasma processing method including: an analysis step of obtaining, by using a multivariate analysis, a correlation between substrate type data set corresponding to a plurality of substrate types classified based on a type of a material of a mask on a film to be processed on the substrate and optical data to be detected by an optical data detection unit when plasma processing the substrate; a determining step of obtaining, based on the correlation obtained in the analysis step, substrate type data from optical data detected by the optical data detection unit when initiating a plasma processing on the substrate, and determining a substrate type of the substrate by using the obtained substrate type data; a selection step of selecting a detection method setting data set corresponding to the substrate type determined in the determining step from detection method setting data sets, each for detecting a plasma processing end point, each of the detection method setting data sets corresponding to one of the substrate type and being stored in advance in a data storage unit; an end point detection step of detecting an end point of the plasma processing based on the detection method setting data set selected in the selection step; and a termination step of terminating the plasma processing at the end point detected in the end point detection step.

It is preferable that the optical data detection unit includes a light source for irradiating a light onto the substrate, and an optical detection unit for detecting optical spectrum data of a reflected light, the reflected light being obtained when light irradiated from the light source is reflected from substrate.

It is preferable that each of the substrate type is classified based on whether a mask formed on the substrate is a hard mask or a photoresist mask. Further, a detection method setting data set for a type of the substrate on which the hard mask is formed is a setting data set for performing a method of detecting a film thickness of the film to be processed based on optical spectrum data of a reflected light from the substrate, the reflected light being obtained by irradiating an irradiation light having a single wavelength reflecting from the film to be processed, and detecting the end point based on the detected film thickness; and a detection method setting data set for a type of the substrate on which the photoresist mask is formed is a setting data set for performing a method of detecting a film thickness of the film based on optical spectrum data of a reflected light from the substrate, the reflected light being obtained by irradiating an irradiation light having a wavelength passing through the photoresist mask and a wavelength reflecting from the photoresist mask, and detecting the end point based on the detected film thickness.

If the type of material of a mask on a substrate (for example, the transmittance of a mask) varies, the characteristics of optical spectrum data reflected from the substrate vary. For this reason, in the case where end point detection is performed using the optical spectrum data, end point detection can be accurately performed regardless of the type of mask pattern by performing end point detection according to the type of the mask pattern.

BRIEF DESCRIPTION OF THE DRAWINGS

The above and other objects and features of the present invention will become apparent from the following description of preferred embodiments given in conjunction with the accompanying drawings, in which:

FIG. 4 is a block diagram showing an example of the schematic construction of a control unit in the first embodiment of the present invention;

FIG. 5 is a view illustrating a detailed example of analysis data in the first embodiment of the present invention;

FIG. 16 is a view illustrating detailed examples of respective recipes illustrated in FIG. 15, wherein FIG. 16(A) is a view illustrating a detailed example of the film thickness data of recipe Ra, and FIG. 16(B) is a view illustrating a detailed example of the film thickness data of recipe Rb;

FIG. 17 is a view illustrating a detailed example of end point detection selection data in a third embodiment of the present invention;

FIG. 19 is a view illustrating an end point detection method Qb for a wafer of type B in which a photoresist mask is formed.

DETAILED DESCRIPTION OF THE EMBODIMENTS

Figure 1:
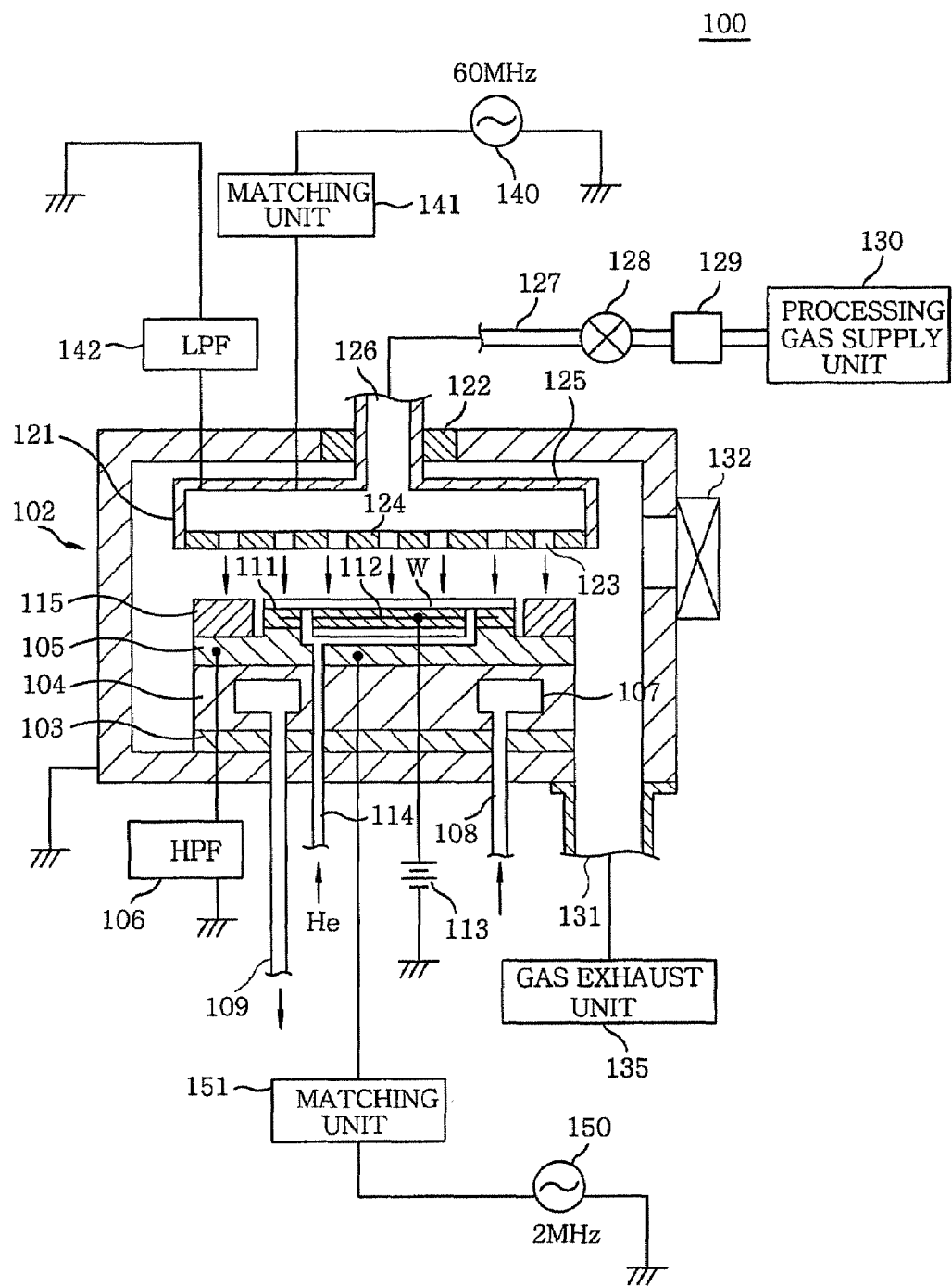
FIG. 1 is a sectional view illustrating the schematic construction of plasma processing apparatus according to a first embodiment of the present invention.

Embodiments of the present invention will be described in detail with reference to the accompanying drawings below. Furthermore, in the present specification and drawings, elements having substantially the same functions are assigned the same reference numerals, and repeated descriptions thereof are omitted.

First Embodiment

The schematic construction of plasma processing apparatus according to a first embodiment of the present invention is described with reference to the drawings. FIG. 1 is a sectional view illustrating an example of the construction of the plasma processing apparatus according to the first embodiment. Here, a parallel plate-type plasma etching apparatus is taken as an example of the plasma processing apparatus.

A plasma processing apparatus 100 includes a processing chamber 102 that has a processing container, the surface of which is made of aluminum having been subjected to, for example, an anode oxidization process (an alumite process), and which is formed in a cylindrical shape. The processing chamber 102 is grounded. A susceptor support 104 having an approximately cylindrical shape is provided on a bottom of the processing chamber 102. The susceptor support 104 mount a wafer W thereon, with an insulating plate 103 made of ceramic being interposed therebetween. A susceptor 105 as a lower electrode is disposed on the susceptor support 104. A high pass filter (HPF) 106 is connected to the susceptor 105.

Temperature control medium chambers 107 are provided in the susceptor support 104. A temperature control medium is introduced into the temperature control medium chamber 107 through an inlet pipe 108, circulated in the temperature control medium chamber 107, and then discharged through an outlet pipe 109. The susceptor 105 can be maintained at a desired temperature through the circulation of the temperature control medium.

The susceptor 105 is formed in a disk shape, the upper center of which is convex. An electrostatic chuck 111 having the substantially same shape as the wafer W is provided on the susceptor 105. The electrostatic chuck 111 includes an electrode 112 disposed in insulating material. A DC voltage of, for example, 1.5 KV, is applied to the electrostatic chuck 111 from a DC power source 113 connected to the electrode 112. Thereby, the wafer W is electrostatically attracted to the electrostatic chuck 111.

Furthermore, a gas passage 114 for supplying a heat transfer medium (for example, backside gas such as He gas) to the back side of the wafer W, that is, an object to be processed, is formed in the insulating plate 103, the susceptor support 104, the susceptor 105, and the electrostatic chuck 111. As a result, heat is transferred between the susceptor 105 and the wafer W via the heat transfer medium, so that the wafer W is maintained at a predetermined temperature.

An annular focus ring 115 is disposed on the top circumferential portion of the susceptor 105 and surrounds the wafer W disposed on the electrostatic chuck 111. The focus ring 115 is made of insulating material, such as ceramic or quartz, or conductive material. By the disposition of the focus ring 115, the uniformity of etching is improved.

Furthermore, an upper electrode 121 is located on opposite side of the susceptor 105 in parallel. The upper electrode 121 is suspended in the processing chamber 102 by an insulating material 122. The upper electrode 121 includes an electrode plate 124 opposite the susceptor 105, the electrode plate 124 having a plurality of discharge holes 123. Further, an electrode support 125 supporting the electrode plate 124. The electrode plate 124 is made of, for example, quartz. The electrode support 125 is made of conductive material, such as aluminum, the surface of which has been subjected to an alumite process. Furthermore, the distance between the susceptor 105 and the upper electrode 121 can be adjusted.

A gas inlet port 126 is provided at the center of the electrode support 125 of the upper electrode 121. A gas feed pipe 127 is connected to the gas inlet port 126. Furthermore, a processing gas supply source 130 is connected to the gas feed pipe 127 via a valve 128 and a massflow controller 129.

An etching gas for plasma etching is supplied from the processing gas supply source 130. Although only a single processing gas supply system including the gas feed pipe 127, the valve 128, the massflow controller 129 and the processing gas supply source 130 has been illustrated in FIG. 1, the plasma processing apparatus 100 may include a plurality of processing gas supply systems. For example, the flow rates of etching gases, such as $CF_4$, $O_2$, $N_2$ and $CHF_3$, are independently controlled and supplied to the processing chamber 102.

An exhaust pipe 131 is connected to the bottom of the processing chamber 102. An exhaust mechanism 135 is connected to the exhaust pipe 131. The exhaust mechanism 135 is equipped with a vacuum pump, such as a turbo-molecular pump, and adjusts the inside of the processing chamber 102 to a predetermined pressure-reduced atmosphere (for example, 0.67 Pa or less). Furthermore, a gate valve 132 is provided on the sidewall of the processing chamber 102. As the gate valve 132 opens, the wafer W can be carried into or out from the processing chamber 102. Furthermore, a wafer cassette, for example, may be used to carry the wafer W.

A first high-frequency power source 140 is connected to the upper electrode 121, and a first matching unit 141 is disposed at a feed line from the first high-frequency power source 140. A low pass filter (LPF) 142 is also connected to the upper electrode 121. The first high-frequency power source 140 can output electrical power having a frequency ranging from 50 to 150 MHz. By applying electrical power having such a high frequency to the upper electrode 121, plasma having a desired dissociation state and a high density can be formed within the processing chamber 102. As a result, plasma processing can be performed under lower pressure conditions than in the prior art. It is preferred that the output power of the first high-frequency power source 140 have a frequency ranging from 50 to 80 MHz, preferably a frequency of 60 MHz, as illustrated in FIG. 1, or a similar frequency.

A second high-frequency power source 150 is connected to the susceptor 105 which functions as the lower electrode. A second matching unit 151 is disposed at a feed line from the second high-frequency power source 150. The second high-frequency power source 150 can output electrical power having a frequency ranging from several hundreds of KHz to several tens of MHz. By applying electrical power having the frequency to the susceptor 105, an appropriate ion action can be applied to the wafer W, that is, an object to be processed, without causing damage to the wafer W. The frequency of the output power of the second high-frequency power source 150 is typically adjusted to 2 MHz, as illustrated in FIG. 1, 13.56 MHz or the like.

(Example of Construction of Optical Data Detection Unit)

Figure 2:
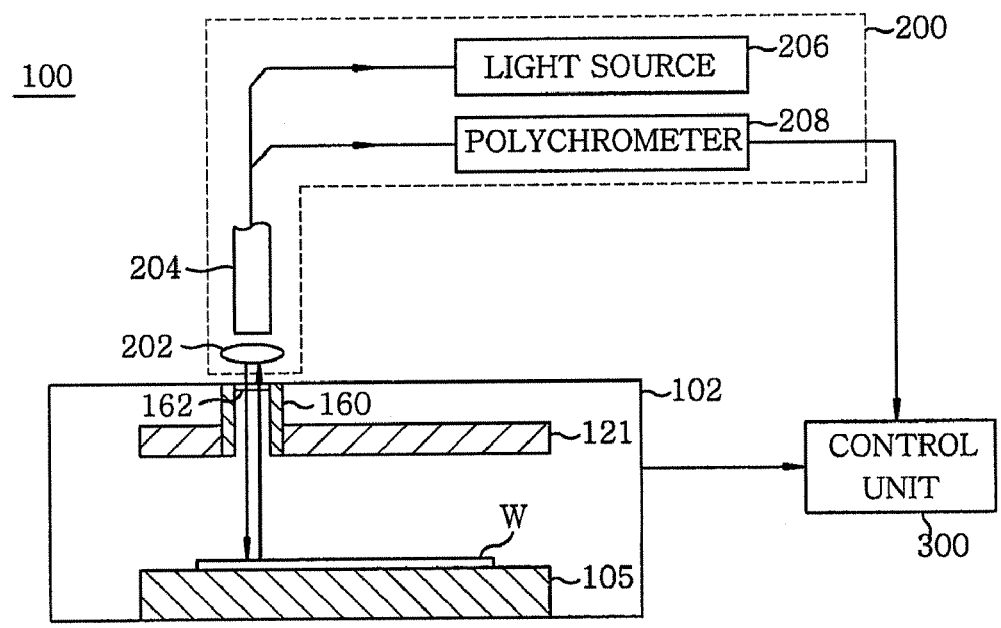
FIG. 2 is a block diagram showing an example of the schematic construction of an optical measuring instrument in the first embodiment of the present invention.

The plasma processing apparatus 100 according to the first embodiment includes an optical measuring instrument as an example of the optical data detection unit for detecting optical data. FIG. 2 is a block diagram showing an example of the construction of the optical measuring instrument. The optical measuring instrument 200 detects optical data, that is optical spectrum data, of light that is reflected from a wafer when light is irradiated onto the wafer.

In more detail, the optical measuring instrument 200, as illustrated in FIG. 2, includes a condensing lens 202, an optical fiber 204, a light source 206, and a polychrometer (an optical detection unit) 208. The light source 206 includes, for example, a xenon lamp, a tungsten lamp, various lasers, or a combination thereof, and can output light having a specific wavelength or light having a plurality of different wavelengths.

A cylindrical observation unit 160 is provided in the upper electrode 121. A window unit 162 made of, for example, quartz glass, is provided at the top of the observation unit 160. The observation unit 160 is optically connected to the light source 206 and the polychrometer 208 through the condensing lens 202 and the optical fiber 204, which are disposed opposite the window unit 162.

Light from the light source 206 is irradiated onto the wafer W via the optical fiber 204 and the observation unit 160. If the light from the light source 206 is reflected from a plurality of portions of the wafer W having different heights, multiple reflected lights interfere with each other. The reflected light (interference light) thereof is incident on and detected by the polychrometer 208 via the optical fiber 204.

Figure 3:
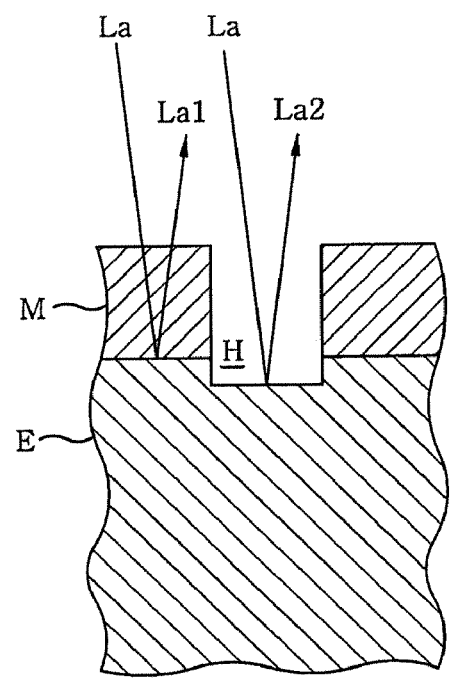
FIG. 3 is a view illustrating light reflected from a wafer.

For example, as illustrated in FIG. 3, the case where a film E to be etched and a mask M having an aperture for forming a hole in the film E are formed on the wafer W is considered. When the wafer W is etched, only the exposed portion (the portion corresponding to the aperture of the mask M) of the film E is slowly etched away, and the hole H is gradually formed. When light La from the light source 206 is irradiated onto the wafer W, it is reflected from the boundary surface between the mask M and the film E, and is also reflected from the exposed surface of the film E (the bottom surface of the hole H). The reflected lights La1 and La2 interfere with each other and detected by the polychrometer 208.

The interference light detected by the polychrometer 208 as described above, is input to a control unit 300 as optical data (for example, optical spectrum data). The control unit 300 uses the optical data to determine the type of wafer, to detect the thickness of the film to be etched on a wafer, and to detect the end point of etching. The detailed processing performed by the control unit 300 will be described later in detail.

Furthermore, spectrum data, which is obtained from plasma when the plasma processing is performed on the wafer, may be used as the optical data. Accordingly, the thickness of a film can be detected based on the optical spectrum data of plasma emission. In this case, the optical measuring instrument may be configured to detect the optical spectrum data of plasma emission.

(Example of Construction of Control Unit)

An example of the construction of the control unit is described with reference to the drawing. FIG. 4 is a block diagram showing an example of the construction of the control unit of the plasma processing apparatus. The control unit 300, as illustrated in FIG. 4, includes a program storage unit 310 for storing a program for executing various processing, an operation unit 320 for controlling the respective elements and executing processing based on the program stored in the program storage unit 310, a data storage unit 330 for storing setting data set when various processing is executed or resulting data that is obtained through processing based on a program, an input/output (I/O) unit 340 for executing the input and output of various data, such as the input of optical data from the optical measuring instrument 200, and various controllers 350 for controlling the respective elements of the plasma processing apparatus 100.

The operation unit 320 may be formed of, for example, a microprocessor. The program storage unit 310 and the data storage unit 320 may be respectively formed of storage media, such as memory or hard disk.

The program storage unit 310 stores a program for executing plasma processing, such as etching a wafer, and a program for executing various types of processing, such as the end point detection for detecting the end point of plasma processing according to the type of wafer, as well as a multivariate analysis program for obtaining the correlation between wafer type data and optical data through multivariate analysis, such as a partial least squares method.

The data storage unit 330 stores analysis data 332 for obtaining the correlation between wafer type data and optical data, correlation data 334 which is the results of the multivariate analysis of the analysis data 332, and end point detection selection data 336 for selecting end point detection setting data according to the type of wafer.

The analysis data 332, as illustrated in FIG. 5, includes information about wafers prepared for the analysis (for example, W1 to W6), information about each wafer type (for example, A and B), wafer type data (for example, 0 and 1) set for the each wafer type, and optical data (for example, optical spectrum data) obtained when the wafers are processed. Furthermore, the configuration of the analysis data 332 is not limited to that shown in FIG. 5.

The wafer types may be classified according to, for example, the type of a mask formed on a film to be etched, that is, an object to be etched (for example, the type of material of a mask, and the type of mask pattern). The wafer types may also be classified according to the type of quality of the film to be etched, or may be classified according to a combination of two or more of the above types.

The case where the wafer types are classified according the type of mask pattern may include the case where they are classified depending on mask patterns having different aperture ratios for a specific region in the masks. The case where wafer types are classified according the type of quality of the film to be etched may include the case where they are classified into an oxide layer and a polysilicon layer.

The case where wafer types are classified according to the type of material of the mask may include the case where they are classified into hard mask and photoresist mask. Since the hard mask may be made of, for example, $SiO_2$, $Si_3N_4$ or the like, and the photoresist mask may be made of, for example, photosensitive material, such as Krf, Arf and i-line material, wafer types may be classified according to the material of the mask.

For wafers having different types of the mask or the film to be etched, optical spectra reflected from the wafers vary in their characteristics. Thus, when the optical spectra are used for the detection of an end point, etc. without considering the wafer types, erroneous detection of the end point may occur. For this reason, in the present invention, the wafer type is determined, and appropriate end point detection is performed for each wafer type, as will be described later. For example, the case illustrated in FIG. 5 corresponds to the case where the number of wafer types is two, and respective wafer types are set to A and B.

The wafers W1 to W6, prepared for analysis, are wafers having already known wafer types, and different numerical values are assigned to respective wafer types A and B. Though the numerical values may be arbitrarily assigned, "0" and positive integers are sequentially assigned in this case. Also, the numerical values may be assigned from 1. The numerical values assigned to respective wafer types are referred to as wafer type data. For example, since the number of wafer types shown in FIG. 5 is two (types A and B), each wafer type data corresponding to the respective wafer types is 0 or 1.

A term "optical data" refers to data of the spectrum intensity (optical spectrum data) in a specific wavelength region (a wavelength band) of reflected light from the wafers, when light irradiates onto a wafer. In more detail, the optical spectrum intensities of wavelengths ranging from 1 to K at predetermined intervals in a specific wavelength region are used. For example, in a range from 195 to 955 nm, the optical spectrum intensities of 153 different wavelengths at intervals of 5 nm are used. For example, when a wafer is etched, the intensity obtained several seconds (for example, 3 seconds) after the initiation of etching is used as the optical spectrum intensity of each wavelength.

Figures 6, 7:
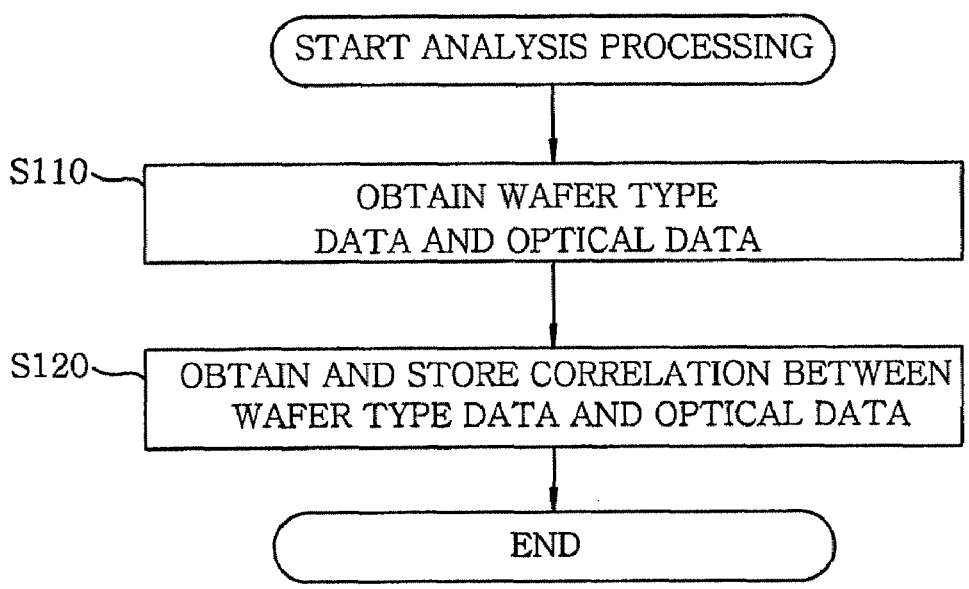
FIG. 6 is a view illustrating a detailed example of end point detection selection data in the first embodiment of the present invention.
FIG. 7 is a flowchart illustrating a detailed example of analysis processing in the first embodiment of the present invention.

The end point detection selection data 336, as illustrated in FIG. 6, includes, for example, wafer types (for example, A and B) and end point detection setting data (for example, Da and Db) related to the respective wafer types. The end point detection setting data are setting data necessary for the detection of an end point. The end point detection setting data may include, for example, an end point detection method, an end point detection recipe, and the combination of the method and the recipe.

As described above, optimal end point detection setting data is determined for each wafer type, and is previously stored as the end point detection selection data 336. When the wafer type is determined as described later, end point detection setting data corresponding to the wafer types is selected. Accordingly, optimal end point detection based on each wafer type can be performed.

The end point detection method includes, for example, a method for detecting an end point based on a film thickness detected using the optical spectrum data of reflected light, which is reflected from a wafer when light is irradiated onto the wafer and obtained, and a method for detecting an end point based on variation in the optical spectrum data of plasma emission. The end point detection recipe may include, for example, the wavelength region (wavelength band) of optical spectrum data used in end point detection, and the type of light source for irradiating light onto a wafer.

Furthermore, in the case where end point detection is performed based on film thickness, the film thickness data may be stored as an end point detection recipe for respective wafer types, and may be selected according to respective wafer types. The film thickness is detected from optical spectrum data obtained when wafers are processed, using film thickness data representing a correlation between film thickness and optical spectrum data of reflected light from the wafer.

The control unit 300 prepares in advance correlation data (model) between wafer type data and optical data through analysis processing using multivariate analysis. In more detail, the following equation [1-1] (prediction relation such as regression equation, a model), in which optical data is used as description variates (description variables) and wafer type data is used as described variates (target variates, target variables), is obtained using a multivariate analysis program. In the following regression equation [1-1], X refers to a matrix of the description variates, and Y refers to a matrix of the described variates. Furthermore, B refers to a regression matrix including the coefficients (weight) of the description variates, and E refers to a residual matrix.

$$Y=BX+E \quad [1\text{-}1]$$

For example, in the case where X is expressed using the optical spectrum data illustrated in FIG. 5, the following mathematical equation [1-2] results. In the case where Y is expressed using the wafer type data illustrated in FIG. 5, the following mathematical equation [1-3] results. Furthermore, in the following mathematical equation [1-2], $\lambda_{a11}$ to $\lambda_{a1K}$ are optical spectrum data obtained when a wafer having a wafer type of Ya is processed, and correspond to the values of the optical spectrum intensities of respective wavelengths ranging from 1 to K.

$$X = \begin{bmatrix} \lambda a_{11} & \lambda a_{12} & \cdots & \lambda a_{1k} \\ \lambda a_{21} & \lambda a_{22} & \cdots & \lambda a_{2k} \\ \lambda a_{31} & \lambda a_{32} & \cdots & \lambda a_{3k} \\ \lambda b_{11} & \lambda b_{12} & \cdots & \lambda b_{1k} \\ \lambda b_{21} & \lambda b_{22} & \cdots & \lambda b_{2k} \\ \lambda b_{31} & \lambda b_{32} & \cdots & \lambda b_{3k} \end{bmatrix} \quad [1\text{-}2]$$

$$Y = \begin{bmatrix} 0 \\ 0 \\ 0 \\ 1 \\ 1 \\ 1 \end{bmatrix} \quad [1\text{-}3]$$

In the first embodiment, a PLS (Partial Least Squares) method disclosed in JOURNAL OF CHEMOMETRICS, VOL. 2 (pp. 211-228) (1998) is used for obtaining the equation [1-1]. Using the PLS method, even if a number of description variates and described variates exist in each of matrices X and Y, the relational equation of X and Y can be obtained if there is a small number of actually measured values in each of matrices X and Y. Furthermore, the PLS method is characterized in that stability and reliability are high even in the relational equation obtained using a small number of actually measured values.

The program storage unit 310 stores a program for the PLS method as the multivariate analysis program, and the operation unit 320 processes wafer type data and optical data according to the order of a program, obtains the regression equation [1-1], and stores the obtained results in the data storage unit 330 as correlation data. Therefore, if the regression equation [1-1] is obtained, the wafer type data can be calculated by applying the optical data to the matrix X as the description variates. Furthermore, the calculated wafer type data is highly reliable.

For example, an i-th main component corresponding to an i-th eigenvalue for an $X^T Y$ matrix has a score expressed as $t_i$. The matrix X is expressed as the following equation [1-4] if the score $t_i$ and vector $p_i$ of the i-th main component are used, and the matrix Y is expressed as the following equation [1-5] if the score $t_i$ and vector $C_i$ of the i-th main component are employed. Furthermore, in the following equations [1-4] and [1-5], $X_{i+1}$ and $Y_{i+1}$ are the residual matrices of X and Y, and $X^T$ is the transposition matrix of the matrix X. Hereinafter, the exponent T refers to the transposition matrix.

$$X = t_1 p_1 + t_2 p_2 + t_3 p_3 + \ldots + t_i p_i + X_{i+1} \quad [1\text{-}4]$$

$$Y = t_1 c_1 + t_2 c_2 + t_3 c_3 + \ldots + t_i c_i + Y_{i+1} \quad [1\text{-}5]$$

The PLS method used in the first embodiment as described above is a method of calculating a plurality of eigenvalues and respective unique vectors with a reduced computational burden by correlating the equations [1-4] with [1-5].

The PLS method is carried out in the following order. First, at a first step, a manipulation of centering and scaling matrices X and Y is performed. Thereafter, i is set to 1, $X_1$ is set to X, and $Y_1$ is set to Y. Furthermore, the first column of the matrix $Y_1$ is set as $u_1$. The manipulation of centering is a manipulation of subtracting the average value of each row from each value in each row. The manipulation (processing) of scaling is a manipulation of dividing each value in each row by the standard deviation of each row.

At a second step, after $w_i = X_i^T u_i / (u_i^T u_i)$ has been obtained, the determinant of $w_i$ is normalized, and $t_i = X_i w_i$ is obtained. Furthermore, the same processing is performed on the matrix Y in order to obtain $c_i = y_i^T t_i / (t_i^T t_i)$, normalize the determinant of $c_i$ and obtain $u_i = Y_i c_i / (c_i^T c_i)$.

At a third step, the X loading (loading amount) $p_i = X_i^T t_i / (t_i^T t_i)$ and the Y loading amount $q_i = Y_i^T u_i / (u_i^T u_i)$ are obtained. Thereafter, $b_i = u_i^T t_i / (t_i^T t_i)$, in which u regresses to t, is obtained. A residual matrix $X_i = Xi - t_i p_i^T$ and a residual matrix $Y_i = Y_i - b_i t_i c_i^T$ are then obtained. Thereafter, i is set to i+1 by incrementing i, and the processing is repeated from the second step. A series of processes is repeated according to the program of the PLS method until specific stop conditions are fulfilled or until the residual matrix $X_{i+1}$ converges at 0. Thereafter, the highest eigenvalue and unique vector of the residual matrix are obtained.

In the PLS method, the convergence at the stop condition of the residual matrix $X_{i+1}$ or 0 is fast, and the residual matrix converges into the stop condition or 0 within only ten calculation iterations. In general, the residual matrix converges at the stop condition or 0 through four to five calculation iterations. The first main component of the $X^T Y$ matrix is obtained using the highest eigenvalue and the unique vector thereof, which are obtained by the calculation processing. Thereafter, the highest correlation between the matrix X and the matrix Y can be known.

(Operation of Plasma Processing Apparatus)

The operation of the plasma processing apparatus 100 is described below. In the first embodiment, the analysis data 332 is first obtained by performing plasma etching on a wafer for analysis (a test wafer). The correlation (the regression equation [1-1]) between wafer type data and optical data is obtained by executing multivariate analysis using the analysis data 332. Wafer processing (for example, the processing of a wafer for a product) with the determination of a wafer type, is then carried out. At this step, optical data is detected at a specific time point after the wafer process starts, wafer type data is calculated by applying the optical data to the regression equation [1-1], and a wafer type is determined based on the calculated wafer type data.

In this case, a detailed example of plasma etching performed on a wafer for analysis or other wafers (for example, wafers for products), which is performed by the plasma processing apparatus 100, is described below. The plasma etching performed in the case where a polysilicon layer, formed as a film E to be etched, and a mask M are formed on the wafer as illustrated in FIG. 3 is described.

An etching process of removing a native oxide layer from the exposed surface of the film E to be etched using a mixed gas including at least $CF_4$ and $O_2$ is performed at the wafer on the susceptor 105 (a breakthrough etching process).

With respect to the conditions for the performance of the breakthrough etching process, for example, the pressure of the processing chamber 102 may be set to 10 mTorr, the distance between the upper electrode 121 and the susceptor 105 may be set to 140 mm, and the gas flow rate ratio of $CF_4/O_2$ (the gas flow rate of $CF_4$/the gas flow rate of $O_2$) may be set to 134 sccm/26 sccm. Furthermore, voltage applied to the electrostatic chuck 110 to attract a wafer may be set to 2.5 KV, and gas pressure used to cool the backside of the wafer W may be set to 3 mTorr for both the center and edge thereof. In addition, with respect to a setting temperature within the processing chamber 102, the lower electrode may be set at a temperature of 75° C., the upper electrode may be set at a temperature of 80° C., and the sidewall unit may be set at a temperature of 60° C.

In the breakthrough etching, high-frequency power is applied to the susceptor 105 and the upper electrode 121. For example, high-frequency power applied to the upper electrode 121 is set to 650 W, and high-frequency power applied to the susceptor 105 is set to 220 W. Accordingly, the native oxide layer of the exposed surface of the film E to be etched is removed.

Thereafter, through the opening of the mask M, a main etching process of etching the film E to be etched in the depth direction is carried out. In the main etching process, a mixed gas including at least HBr and $O_2$ is used as processing gas, and the film E to be etched is etched in the depth direction through the opening of the mask M. The film E to be etched is etched, for example, up to 85% of the depth of the original film thickness.

For conditions for the performance of the main etching, for example, the pressure in the processing chamber 102 may be set to 20 mTorr, the distance between the upper electrode 121 and the susceptor 105 may be set to 140 mm, and the gas flow rate ratio of $HBr/O_2$ (the gas flow rate of HBr/the gas flow rate of $O_2$) can be set to 400 sccm/1 sccm. Furthermore, voltage applied to the electrostatic chuck 110 to attract the wafer may be set to 2.5 KV, and gas pressure used to cool the backside of the wafer W may be set to 3 mTorr for both the center and edge thereof. In addition, with respect to a setting temperature in the processing chamber 102, the lower electrode may be set at a temperature of 75° C., the upper electrode may be set at a temperature of 80° C., and the sidewall unit may be set at a temperature of 60° C.

In the main etching process, relatively high-frequency power is applied to the susceptor 105 and the upper electrode 121. For example, the high-frequency power applied to the upper electrode 121 is set to 200 W, and the high-frequency power applied to the susceptor 105 is set to 100 W. By doing so, the film E to be etched, which is exposed through the opening of the mask M, is selectively etched, and the hole H is formed in the film E to be etched.

In the plasma etching, reflected light, which is reflected from the wafer when light is irradiated from the light source, is detected as optical data (for example, optical spectrum data) using the optical measuring instrument 200.

For example, wafers for analysis are prepared for all wafer types that can be processed in the processing chamber 102, respective optical data is obtained by executing the plasma etching, wafer type data is set for respective wafer types, and the wafer type data and the optical data are stored in the data storage unit 330 as the analysis data 332. The analysis data preferably includes multiple pieces of data for respective wafer types. The greater the number of pieces of analysis data, the higher the reliability of a model.

(Detailed Example of Analysis Processing)

A detailed example of the analysis processing for obtaining the correlation between wafer type data and optical data using the analysis data 332 is described below. FIG. 7 is a flowchart illustrating a detailed example of the analysis processing. At step S110, wafer type data and optical data used in the analysis processing are obtained. In more detail, for example, wafer type data and optical data are obtained from the analysis data 332 stored in the data storage unit 330.

At step S120, the correlation between the wafer type data and the optical data is obtained. In other words, multivariate analysis using the PLS method is performed based on the wafer type data and the optical data, the correlation between the wafer type data and the optical data (for example, the regression equation [1-1]) is obtained, and the correlation data 334 is stored in the data storage unit 330.

(Detailed Example of Wafer Processing Based on Analysis Results)

Figure 8:
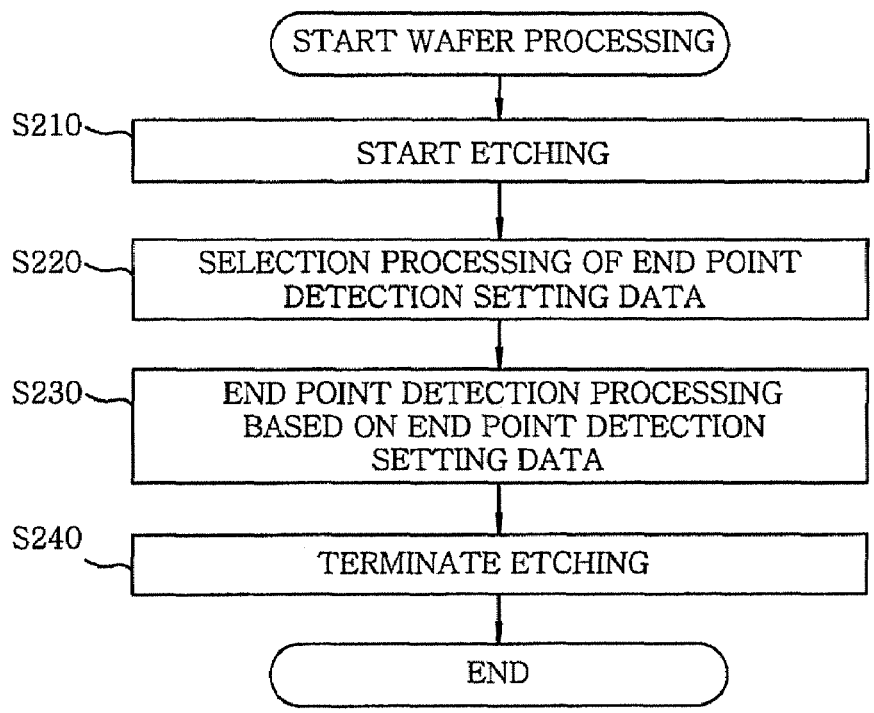
FIG. 8 is a flowchart illustrating a detailed example of wafer processing in the first embodiment of the present invention.

A detailed example of the wafer processing performed using the results of the analysis processing is described with reference to the drawing below. FIG. 8 is a flowchart illustrating a detailed example of the wafer processing according to the first embodiment. In this case, the plasma etching is performed on wafers (that is, wafers for products), other than wafers for analysis. In the wafer processing, a wafer type is determined based on the correlation data 334 just after the etching process starts. Then, end point detection setting data is selected according to the wafer type, and the end point of etching is detected based on the end point detection setting data.

In more detail, as illustrated in FIG. 8, the plasma etching is first performed on the wafer at step S210. The processing for selecting end point detection setting data is performed at step S220. In this case, the plasma etching is the same as described above.

Figure 9:
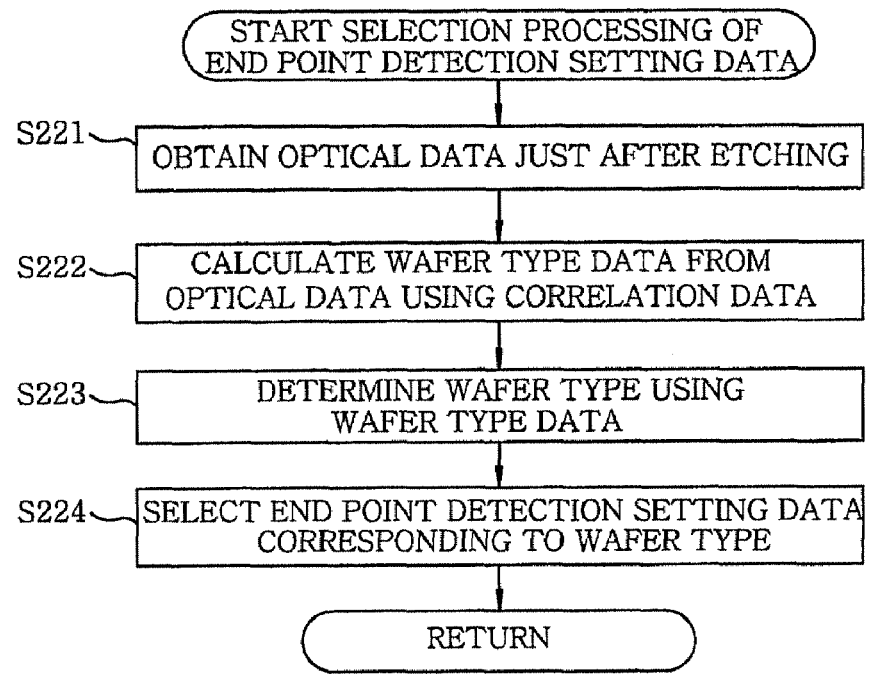
FIG. 9 is a flowchart illustrating a detailed example of the selection processing of end point detection setting data illustrated in FIG. 8.

The processing for selecting the end point detection setting data at step S220 is performed, for example, as illustrated in FIG. 9. That is, optical data are obtained using the optical measuring instrument 200 when the etching has begun at step S221, for example, several seconds (for example, 3 seconds) after etching has begun.

At step S222, wafer type data is calculated based on the obtained optical data using the correlation data 334 stored in the data storage unit 330. In more detail, the wafer type data is calculated by applying the optical data to the regression equation [1-1], that is, the correlation data 334.

Figure 11:
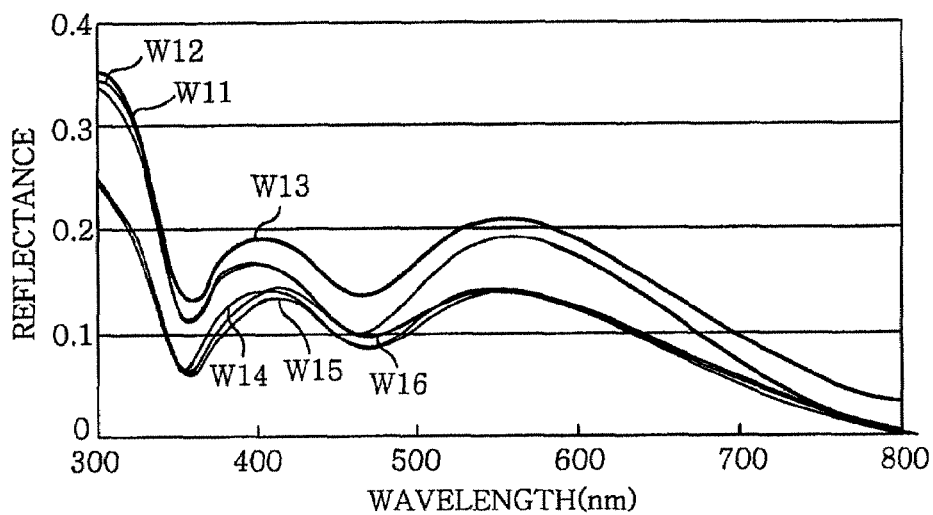
FIG. 11 is a view illustrating a detailed example of optical spectrum data when plasma processing starts to be performed on two types of wafers.

For example, in the case where the wafers W11 to W16 are etched, optical spectrum data, that is, optical data obtained 3 seconds after the etching has begun, is as shown in FIG. 11. In FIG. 11, wavelengths are represented on a lateral axis, and the light intensity of each wavelength is represented as reflectance on a vertical axis. The optical spectrum data in the wavelength region, illustrated in FIG. 11, is divided into approximately two types of curve groups, that is, a curve group of wafers W11 to W13 and a curve group of wafers W14 to W16.

At step S223, wafer types A and B are determined based on the calculated wafer type data. If the calculated wafer type data is close to, for example, wafer type data 0, set in advance as the analysis data 332 illustrated in FIG. 5, the wafer type is determined to be A. If the calculated wafer type data is close to wafer type data 1, the wafer type is determined to be B.

Figure 12:
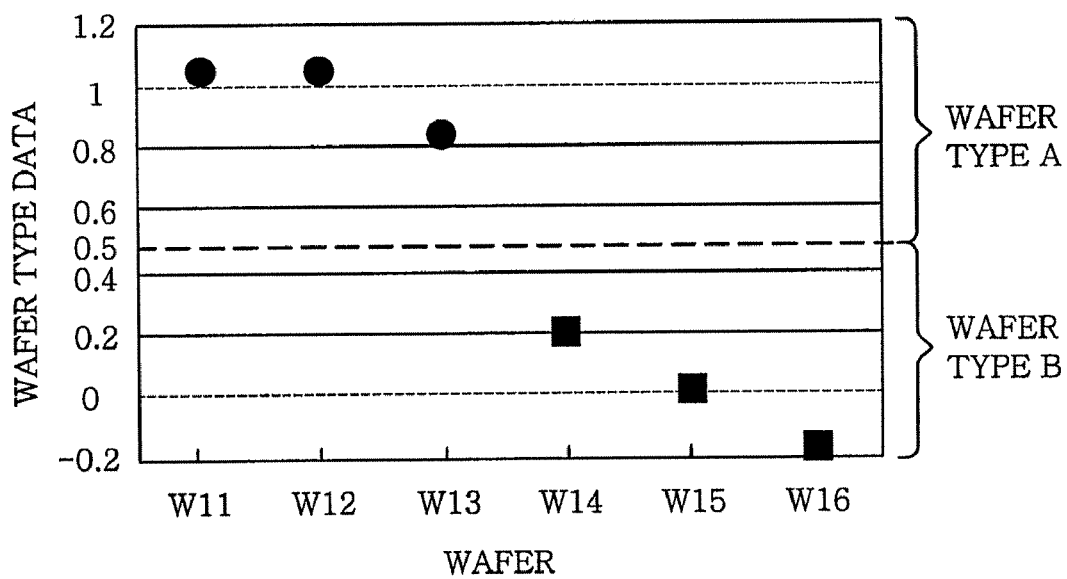
FIG. 12 is a view plotting wafer type data calculated from respective pieces of optical spectrum data illustrated in FIG. 11.

For example, wafer type data calculated by applying the optical spectrum data of the wafers W11 to W16 to the regression equation [1-1] is plotted in FIG. 12. Referring to FIG. 12, it can be seen that the wafer type data is divided into approximately two types of data groups, that is, a data group of wafers W11 to W13 and a data group of wafers W14 to W16, to correspond to the curve groups of the optical spectrum data. The data group of the wafers W11 to W13 is a value close to 1, and the data group of the wafers W14 to W16 is a value close to 0. Accordingly, a critical value is set to 0.5, that is, an intermediate value between 0 and 1, and the wafer type is determined to be A when the calculated wafer type data is equal to or lower than the critical value, and the wafer type is determined to be B when the calculated wafer type data is equal to or higher than the critical value.

Thereafter, end point detection setting data corresponding to the determined wafer type is selected at step S224. In more detail, end point detection setting data corresponding to the wafer type, which is determined from the selection data 336 for the end point detection stored in the data storage unit 330, is selected. For example, in the case of the end point detection selection data 336 illustrated in FIG. 6, the end point detection setting data Da is selected when the wafer type is A, and the end point detection setting data Db is selected when the wafer type is B.

Figure 10:
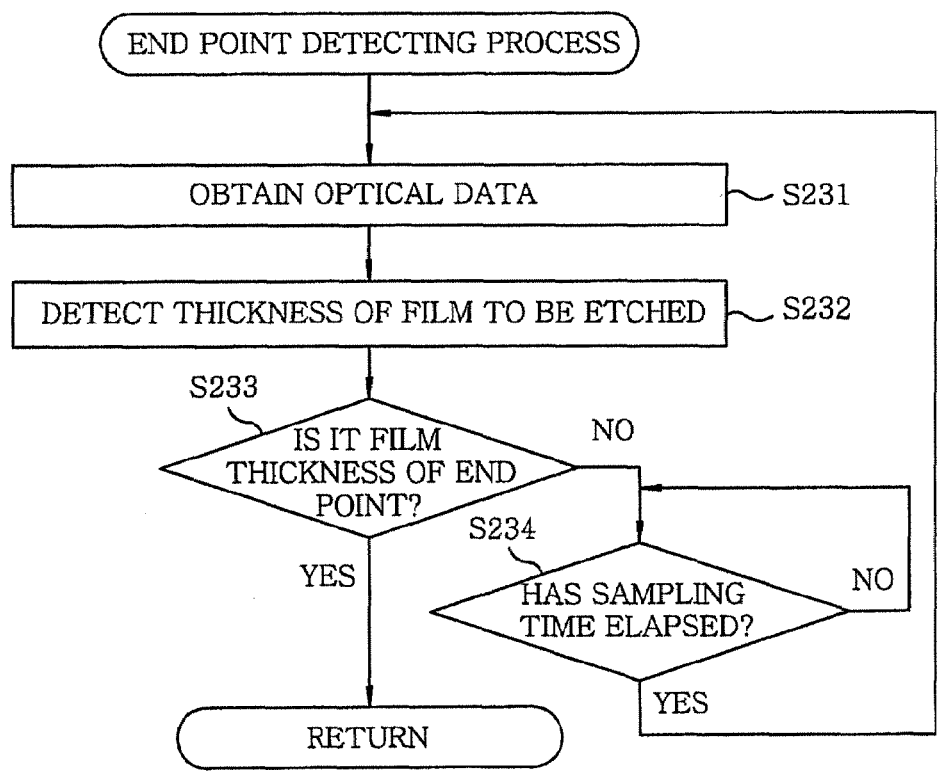
FIG. 10 is a flowchart illustrating a detailed example of the end point detection processing illustrated in FIG. 8.

The process then goes to step S230, illustrated in FIG. 8. At step S230, the end point detection processing is performed based on the selected end point detection setting data (for example, an end point detection recipe). A detailed example of the end point detection processing is illustrated in FIG. 10. In this example, an end point is detected based on the thickness of the film to be etched, which is obtained from optical spectrum data. In this case, the end point detection setting data Da and Db illustrated in FIG. 6 is a method or recipe for detecting the film thickness from, for example, optical spectrum data.

In the end point detection processing, for example, while the wafer process is executed as illustrated in FIG. 10, the optical spectrum data are obtained using the optical measuring instrument 200 at step S231, and the thickness of the film to be etched is detected at step S232. In this case, for example, when the wafer type is A, the film thickness is detected from the optical spectrum data using the end point detection setting data Da. When the wafer type is B, the film thickness is detected from the optical spectrum data using the end point detection setting data Db. Accordingly, the film thickness can be detected accurately regardless of wafer type.

Thereafter, at step S233, it is determined whether the detected film thickness is the film thickness at the end point of etching (a previously set target film thickness). If, as a result of the determination at step S233, the detected film thickness is not the film thickness at the end point of etching, it is determined whether a sampling time has elapsed, at step S234. If, as a result of the determination at step S234, the sampling time has elapsed, the process returns to step S231, at which optical data are obtained. By doing so, optical data is obtained every specific sampling time, and the film thickness of a film to be etched is detected. Further, it is determined whether the detected film thickness is the film thickness at the end point of etching. If, as a result of the determination at step S233, the detected film thickness is the film thickness at the end point of etching, the process returns to the process illustrated in FIG. 8, and the etching is then finished at step S24.

Figure 13:
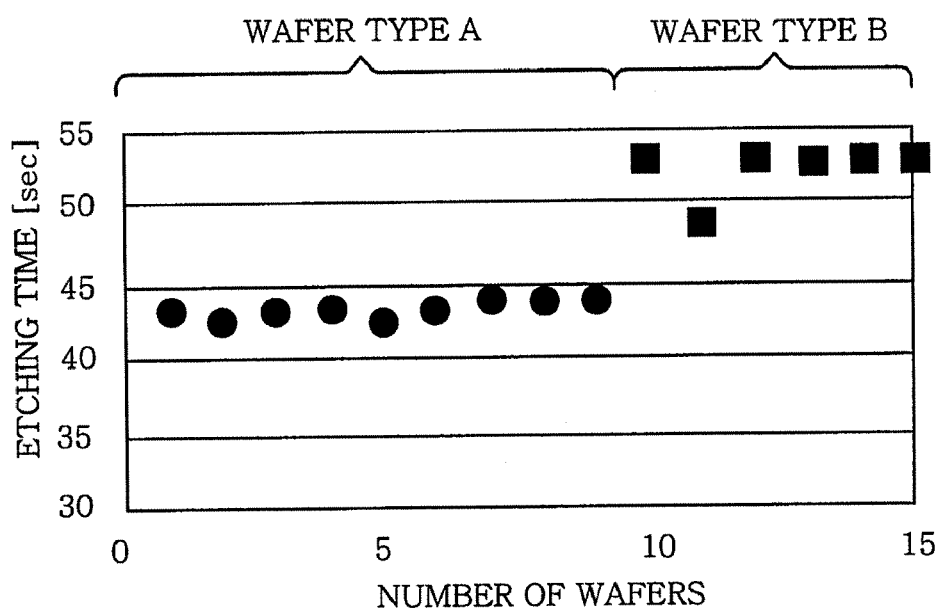
FIG. 13 is a view plotting the etching time when end point detection is performed based on the same end point detection setting data regardless of wafer type.
Figures 14, 15:
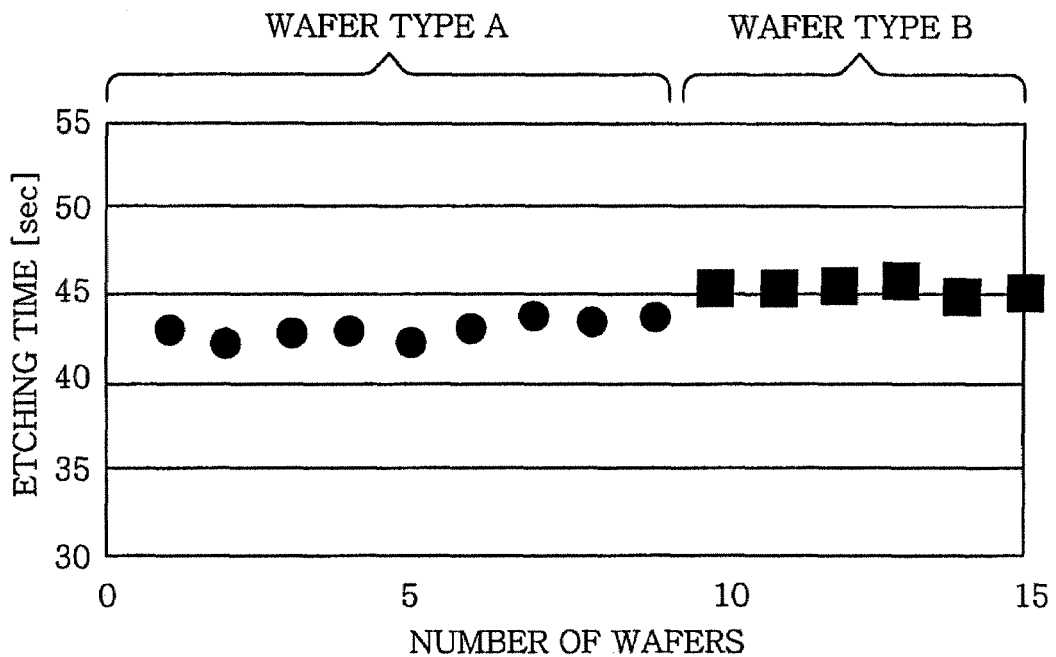
FIG. 14 is a view plotting the etching time when end point detection is performed based on end point detection setting data selected through the determination of a wafer type.
FIG. 15 is a view illustrating a detailed example of end point detection selection data in a second embodiment of the present invention.

The results of experiments in which plasma etching processing was performed on the wafer types A and B are described below with reference to the drawings. FIG. 13 illustrates the case where end point detection was performed based on the same end point detection setting data (in this case, the wavelength region (wavelength band) of optical spectrum data used in end point detection). FIG. 14 illustrates the case where end point detection was performed based on end point detection setting data selected by determining the wafer type. In this case, end point detection was performed by performing plasma etching processing on 9 wafers of type A and 6 wafers of type B, and etching time was detected in the case where the processing was finished at the detected end point. The wafer types A and B have the different aperture ratios of mask patterns on the wafer. Furthermore, the wafer types A and B have the same material of the film to be etched and the same material of the mask, which are formed on the wafer.

The experimental results reveal that, when the same end point detection setting data (a wavelength region) was used regardless of wafer type (FIG. 13), erroneous detection occurred between the etching time data group of wafer type A and the etching time data group of wafer type B. In contrast, the experimental results reveal that, when end point detection setting data (a wavelength region), selected according to wafer type, was used (FIG. 14), erroneous detection rarely occurred between the etching time data group of wafer type A and the etching time data group of wafer type B. From this, it could be seen that erroneous detection in etching time can be eliminated using the end point detection setting data selected according to wafer type. As described above, in the first embodiment, since end point detection setting data can be selected according to wafer type, end point detection can be performed according to the wafer type. Accordingly, end point detection can be performed accurately regardless of wafer type.

Second Embodiment

A second embodiment of the present invention is described below with reference to the drawings. Since the constructions of the plasma processing apparatus 100 and the optical measuring instrument 200 used in the second embodiment are the same as those illustrated in FIGS. 1 and 2, a detailed description thereof is omitted here. In the second embodiment, a description is made below, taking as an example the case where wafer types are classified according to the type of mask pattern formed on the film to be etched and an optimal end point detection recipe (for example, film thickness data) is used according to the type of mask pattern.

(Wafer Type and End Point Detection Setting Data)

There is a case where an accurate etching end point cannot be detected depending on the type of mask pattern. In the second embodiment, types of wafers having different types of mask patterns are determined, and the end point detection method according to the type of each mask pattern is selected as end point detection setting data. Therefore, an accurate etching end point can be detected regardless of the type of mask pattern.

In this case, the end point detection selection data 336 is illustrated in FIG. 15. The wafer types can be classified, for example, according to the aperture ratio of a specific region in the mask pattern. Further, when there are two types of mask patterns (for example, a first mask pattern and a second mask pattern), the type of wafer of the first mask pattern is set to A and the type of wafer of the second mask pattern is set to B. Furthermore, end point detection setting data corresponding to the wafer type A is set to an end point detection recipe Ra, and end point detection setting data corresponding to the wafer type B is set to an end point detection recipe Rb.

For example, a film E to be etched and a mask M having an opening for forming a hole in the film E are formed on each of the wafers A and B, as illustrated in FIG. 3. The film E of a wafer of type A may be formed of a polysilicon layer, and a mask M may be formed of a hard mask of $SiO_2$ or the like. However, the film E and the hard mask M are not limited to the above materials. For example, the mask M may be formed of a hard mask of $Si_3N_4$ or a photoresist mask of photoresist material (photosensitive material). Furthermore, the mask M of the wafer of type A may be patterned in a first mask pattern. However, the mask M of the wafer of type B may be patterned in a second mask pattern having an aperture ratio different from that of the first mask pattern.

(End Point Detection Method)

A method of detecting the end point of etching according to the second embodiment is described below. In this case, the end point detection method is applied to both wafers of types A and B in the same manner. In more detail, as illustrated in FIG. 3, a single ray of light La from the light source 206 is irradiated onto a wafer W. Then, the irradiated light La is reflected from the boundary surface between the mask M and the film E to be etched, or is reflected from the exposed surface (the bottom surface of the hole H) of the film E to be etched. The reflected lights interfere with each other, and interference light is detected by the polychrometer 208. The interference light detected by the polychrometer 208 is input to the control unit 300 as optical data (optical spectrum data).

The optical spectrum data consists of the light intensities of respective wavelengths as described above. When the film E is etched and the film thickness of the film changes accordingly, the light intensities of respective wavelengths vary. Accordingly, the characteristics of the optical spectrum data are changed. As a result, if film thickness data representing the correlation between the film thickness and the optical spectrum data is prepared in advance, the thickness of the film E can be obtained in real time from the optical spectrum data, which is detected by the polychrometer 208 every time a sample is taken, using the film thickness data while the wafer is being etched.

When the thickness of the film E is obtained, the optical spectrum data detected by the polychrometer 208 is compared with the optical spectrum data of the film thickness data, and a film thickness corresponding to the optical spectrum data of the film thickness data having the best match is obtained as the thickness of the film E to be etched. By doing so, the thickness of the film E is monitored, and etching is finished at the time at which the film E reaches a predetermined thickness.

Furthermore, since the light intensity for each wavelength in the optical spectrum data varies with the type of mask pattern (the aperture ratio), the characteristics of the optical spectrum data vary. Accordingly, in the second embodiment, two types of film thickness data corresponding to the wafer types A and B, respectively, are written as the end point detection recipes Ra and Rb. Thereafter, the film thickness can be obtained using the film thickness data of the end point detection recipe Ra with respect to the wafer type A and the film thickness data of the end point detection recipe Rb with respect to the wafer type B.

In more detail, wafers equivalent to the wafers of types A and B according to the second embodiment are prepared, and the plasma etching process is performed on the wafer. Two types of film thickness data representing the correlation between film thickness and optical spectrum data are prepared by measuring the film thickness of the film E (for example, the film thickness of an exposed portion) while obtaining the optical spectrum data. Furthermore, the end point detection selection data 336, in which the two types of film thickness data correspond to the wafer types A and B, respectively, are stored in the data storage unit 330 as the end point detection methods Ra and Rb.

Detailed examples of the film thickness data for the end point detection methods Ra and Rb are illustrated in FIGS. 16(A) and 16(B), respectively. The film thickness data can include, for example, film thickness (T1, T2, T3, . . . ) at predetermined intervals, which are used in film thickness detection, and optical spectrum data, which must be obtained in detecting the film thickness, as illustrated in FIGS. 16(A) and 16(B). In this case, the optical spectrum data is the light-emitting intensities for respective wavelengths in a wavelength region (a wavelength band). The wavelength region of the optical spectrum data may change according to wafer type. By setting a wavelength region having the greatest difference in characteristics according to wafer type, such as a wavelength region having a significant change in light-emission intensity, the detection of an end point can be performed more accurately. Furthermore, the wavelength region of the optical spectrum data may be the end point detection recipes Ra and Rb.

(Example of Operation of Plasma Processing Apparatus)

An example of the operation of the plasma processing apparatus 100 according to the second embodiment is described below. In the plasma processing apparatus 100 according to the second embodiment, the correlation between wafer type data and optical data is obtained in advance in the same manner as the first embodiment. In other words, for example, the analysis data 332, such as that illustrated in FIG. 5, is obtained and multivariate analysis is performed using the analysis data 332 through analysis processing, as illustrated in FIG. 7. By doing so, the correlation (the regression equation [1-1]) between the wafer type data and the optical data is obtained, and the correlation data 334 obtained as a result of the analysis is stored in the data storage unit 330.

Wafer processing (for example, the processing of a product wafer), which is accompanied by the determination of a wafer type, is then performed. In the wafer processing, the wafer type has been determined using the correlation data 334 after the initiation of etching. Thereafter, end point detection setting data is selected according to the wafer type, and the end point of etching is detected based on the end point detection setting data, as illustrated in FIG. 8. In the second embodiment, in the case where the wafer type is determined to be A, the end point detection recipe Ra is selected as the end point detection setting data. End point detection is performed while the thickness of a film to be etched is detected based on the film thickness data of the end point detection recipe Ra. Furthermore, in the case where the wafer type is determined to be B, the end point detection recipe Rb is selected as the end point detection setting data. Then, end point detection is performed while the thickness of a film to be etched is detected based on the film thickness data of the end point detection recipe Rb. When the end point of etching is detected, the etching is finished.

By doing so, wafer types classified according to the type of mask pattern can be automatically determined, and an end point detection recipe according to the determined wafer type can be automatically selected. Accordingly, end point detection can be performed accurately regardless of the type of mask pattern.

Third Embodiment

A third embodiment of the present invention is described below with reference to the drawings. Since the constructions of the plasma processing apparatus 100 and the optical measuring instrument 200 according to the third embodiment are the same as those illustrated in FIGS. 1 and 2, detailed descriptions thereof are omitted here. In the third embodiment, a description is made, taking as an example the case where wafer types are classified according to the type of material of the mask formed on a film to be etched and an optimal end point detection method is used according to the type of material of the mask.

(Wafer Type and End Point Detection Setting Data)

There is a case where the end point of etching cannot be accurately detected due to the different types of material of the mask (for example, a hard mask and a photoresist mask) Accordingly, in the third embodiment, the types of wafers are determined based on the type of mask material, and an end point detection method is selected according to the type of material of the mask as end point detection setting data. Thereby, the accurate end point of etching can be detected regardless of the type of material of the mask.

In this case, the end point detection selection data 336 is represented as illustrated in FIG. 17. In FIG. 17, wafer types are classified based on the transmittance of light. For example, masks are classified into a hard mask and a photoresist mask, and the type of wafer on which a hard mask is formed is set to A and the type of wafer on which a photoresist mask is formed is set to B. End point detection setting data corresponding to the wafer type A is set to Qa, and end point detection setting data corresponding to the wafer type B is set to Qb.

Figure 18A:
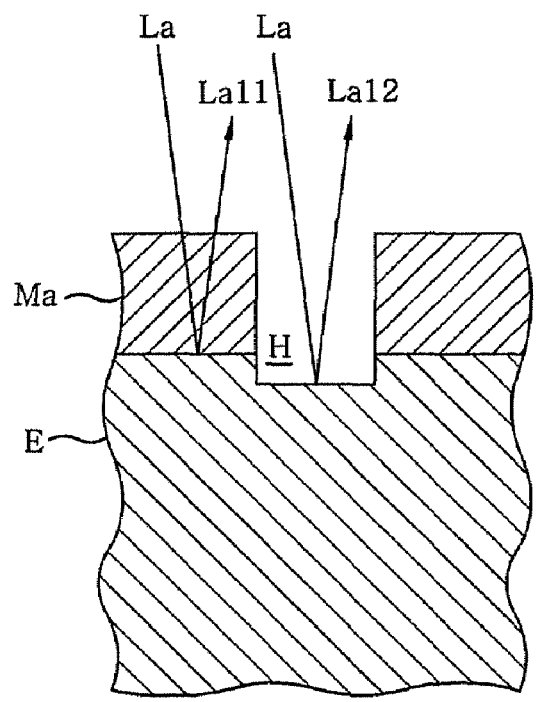
FIG. 18 is a view illustrating an end point detection method Qa for a wafer of type A in which a hard mask is formed.

For example, a film E to be etched and a hard mask Ma having an opening for forming a hole in the film E are formed on the wafer of type A, as illustrated in FIG. 18(A). The film E of the wafer of type A is formed of, for example, a polysilicon layer, and the hard mask Ma is made of, for example, $SiO_2$. However, the film E and the hard mask Ma are not limited to the above materials, but the hard mask Ma may be made of, for example, $Si_3N_4$, or the like.

In contrast, for example, a film E to be etched and a hard mask Mb having an opening for forming a hole in the film E are formed on the wafer of type B, as illustrated in FIG. 19(A). The film E of the wafer of type B is formed of, for example, a polysilicon layer in the same manner as the wafer of type A, and the hard mask Mb is made of, for example, photoresist material, such as i-line material. However, the film E and the hard mask Mb are not limited to the above materials, but the hard mask Mb may be made of, for example, photosensitive material, such as Krf or Arf.

(End Point Detection Method)

Figure 18B:
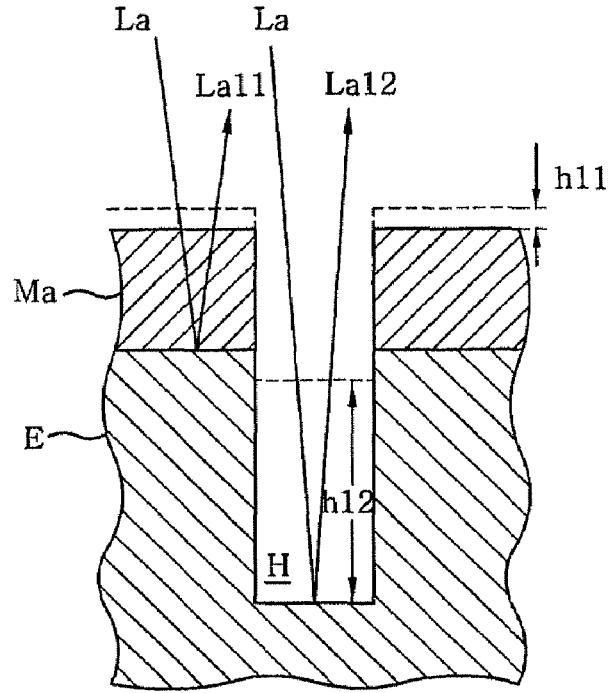

The end point detection methods Qa and Qb of etching according to the third embodiment are described below. First, the end point detection method Qa is described below. When the wafer of type A on which the hard mask Ma is formed is etched further from the state illustrated in, for example, FIG. 18(A), only the exposed portion (corresponding to the opening of the mask Ma) of the film E is slowly etched, thereby forming a hole H, as illustrated in FIG. 18(B). In this case, etching can be performed using a mixture of, for example, HBr gas and $O_2$ gas, as processing gas.

In this case, single light La from the light source 206 is irradiated onto the wafer W. The irradiated light La passes through the hard mask Ma, and is reflected from the boundary surface between the hard mask Ma and the film E while being reflected from the exposed surface (the bottom surface of the hole H) of the film E. The reflected lights La11 and La12 interfere with each other, and interference light thereof is detected by the polychrometer 208. The interference light Lai detected by the polychrometer 208 is input to the control unit 300 as optical data (optical spectrum data).

By doing so, the light intensity of the interference light Lai (the light intensity of each wavelength of optical spectrum data) detected by the polychrometer 208 periodically increases or decreases as the hole H is deepened, for example, from the state illustrated in FIG. 18(A) to the state illustrated in FIG. 18(B). Accordingly, the control unit 300 receives the light intensity of the interference light Lai, detected by the polychrometer 208, for example, at a specific sampling time, and can calculate the film thickness (the remaining film amount to be etched) of the film E in real time based on the amount of etching of the film E (for example, the depth h12 of the hole H), which is obtained according to variation in the light intensity of the interference light Lai. Thereafter, at the time at which the film E reaches a predetermined film thickness, the etching is finished.

Furthermore, in the end point detection method Qa, the light La irradiated from the light source 206 passes through the hard mask Ma. Accordingly, even though the surface of the hard mask h11 is cut by etching, it does not influence the calculation of the film thickness of the film E.

Next, the end point detection method Qb is described below. In the wafer of type B, on which the photoresist mask Mb is formed, for example, when etching is further performed in the state illustrated in FIG. 19(A), only the exposed portion of the film E (corresponding to the opening of the mask Mb) is slowly etched, as illustrated in FIG. 19(B), thereby forming a hole H. In this case, etching can be performed using a mixture of, for example, HBr gas and $O_2$ gas, as processing gas in the same manner as the wafer of type A.

In the wafer of type B, there is a case where the film thickness of the film E to be etched cannot be detected only using the single irradiated light La from the light source 206 in the same manner as the end point detection method Qa. In the case of the photoresist mask Mb having a high absorption coefficient for the wavelength of the irradiated light La from the light source 206, the irradiated light La does not pass through the photoresist mask Mb, unlike the case of the hard mask Ma. Thus, a reflected light from the boundary surface between the photoresist mask Mb and the film E is not obtained. Accordingly, even though the single irradiated light La is irradiated from the light source 206, the thickness of the film E cannot be detected. As a result, an end point detection method Qb that irradiates multiple lights having different wavelengths (for example, irradiated light La and Lb) from the light source 206 onto the wafer is performed on a wafer of type B.

In more detail, two rays of light having different wavelengths (the first irradiated light La and the second irradiated light Lb) are irradiated from the light source 206 onto the wafer W. For example, the wavelength of the irradiated light La is set to 261 nm, and the wavelength of the irradiated light Lb is set to 387 nm. The wavelength 261 nm of the irradiated light La is included in the light absorbing band of the photoresist mask Mb, so that the irradiated light La cannot pass through the photoresist mask Mb. Accordingly, the irradiated light La is reflected from the top surface of the photoresist mask Mb and is reflected from the exposed surface of the film E (the bottom surface of the hole H). The reflected lights La21 and La22 interfere with each other, and a first interference light Lai is detected by the polychrometer 208. The first interference light Lai detected by the polychrometer 208 is input to the control unit 300 as first optical data (first optical spectrum data).

Meanwhile, the irradiated light Lb has a wavelength of 387 nm, which is longer than the wavelength 261 nm of the irradiated light La. Thus, the irradiated light Lb passes through the photoresist mask Mb, and is reflected from the boundary surface between the photoresist mask Mb and the film E, and the top surface of the photoresist mask Mb. The reflected lights Lb21 and Lb22 interfere with each other, and a second interference light Lbi is detected by the polychrometer 208. The second interference light Lbi detected by the polychrometer 208 is input to the control unit 300 as second optical data (second optical spectrum data).

By doing so, the light intensities of the interference lights Lai and Lbi detected by the polychrometer 208 (the light intensity of each wavelength of optical spectrum data) periodically increase or decrease as the hole H is deepened, from the state illustrated in FIG. 19(A) to the state illustrated in FIG. 19(B). Accordingly, the control unit 300 receives information about the light intensities of the interference lights Lai and Lbi detected by the polychrometer 208, for example, at a specific sampling time, and calculates the thickness of the film E (for example, the depth of the hole H) based on variation in the light intensities of the interference lights Lai and Lbi.

In more detail, the film thickness (the remaining film amount to be etched) of the film E can be calculated based on the etching amount of the film E (an absolute depth dimension h22 of the hole H). The etching amount is obtained by adding the amount of etching (the amount of abrasion h21) of the photoresist mask Mb, which is obtained based on variation in the intensity of the second interference light Lbi, to the depth at the bottom of the hole H (the difference in height between the top surface of the photoresist mask Mb and the bottom surface of the hole H), which is obtained based on variation in the intensity of the first interference light Lai. When the film E reaches a predetermined film thickness, the etching is finished.

Furthermore, in the end point detection method Qb, both the irradiated lights La and Lb from the light source 206 reflect from the top surface of the photoresist mask Mb. Thus, even though the surface of the photoresist mask Mb is cut by etching and the location of the surface is deviated, it does not influence the calculation of the thickness of the film E.

(Example of Operation of Plasma Processing Apparatus)

An example of the operation of the plasma processing apparatus 100 according to the third embodiment is described below. In the plasma processing apparatus 100 according to the third embodiment, the correlation between wafer type data and optical data is obtained in advance in the same manner as in the first embodiment. In more detail, for example, analysis data 332, such as that illustrated in FIG. 5, is obtained, and multivariate analysis is performed using the analysis data 332 through analysis processing, such as that illustrated in FIG. 7. Accordingly, the correlation (the regression equation [1-1]) between the wafer type data and the optical data is obtained. Thereafter, correlation data 334 obtained as a result of the analysis is stored in the data storage unit 330.

Wafer processing (for example, the processing of a product wafer) with the determination of a wafer type is then performed. In the wafer processing, after the initiation of etching, the wafer type is determined using the correlation data 334, as illustrated in FIG. 8. Thereafter, end point detection setting data is selected according to the wafer type, and the end point of etching is detected based on the end point detection setting data. In the third embodiment of the present invention, in the case where the wafer type is determined to be A, the end point detection method Qa is selected as the end point detection setting data, and the detection of the end point is performed using the end point detection method Qa. Furthermore, in the case where the wafer type is determined to be B, the end point detection method Qb is selected as the end point detection setting data, and the detection of the end point is performed using the end point detection method Qb. When the end point of etching is detected, the etching is finished.

By doing so, wafer types classified according to the type of material of the mask can be automatically determined, and an end point detection method can be automatically selected according to the determined wafer type. Accordingly, an accurate end point can be detected regardless of the type of material of the mask.

Although the embodiments have been described with reference to the accompanying drawings, the present invention is not limited to the embodiments. It will be apparent to those skilled in the art that various modifications and variations are possible without departing from the scope of the appended claims. It should be understood that such modifications and variations fall within the technical scope of the present invention.

For example, although, in the above-described embodiments, the case where etching is performed on wafers as plasma processing has been taken as an example, the plasma processing method of the present invention is not limited to etching, and the present invention may be applied to the case where a different type of plasma processing, such as film forming, is performed on wafers.

As described above, according to the present invention, the type of substrate can be automatically determined, and end point detection setting can automatically be selected according to the determined type of substrate. By doing so, end point detection can be performed according to the type of substrate.

The present invention can be applied both to plasma processing method and to plasma processing apparatus.

While the invention has been shown and described with respect to the embodiments, it will be understood by those skilled in the art that various changes and modifications may be made without departing from the spirit and scope of the invention as defined in the following claims.

What is claimed is:

1. A plasma processing method for generating a plasma of a processing gas by applying a high frequency power to an electrode provided in a processing chamber and processing a substrate using the plasma, the plasma processing method comprising:

an analysis step of obtaining, by using a multivariate analysis, a correlation between type data set corresponding to a plurality of types classified based on a type of a mask or a film to be processed that is disposed on the substrate and optical data to be detected by an optical data detection unit when plasma-processing the substrate;

a determining step of obtaining, based on the correlation obtained in the analysis step, type data from optical data detected by the optical data detection unit when initiating a plasma processing on the substrate, and determining a type of the substrate by using the obtained type data, the type of the substrate corresponding to the type of the mask or the film to be processed on the substrate;

a selection step of selecting a setting data set corresponding to the type of substrate determined in the determining step from setting data sets, each of the setting data sets serving to detect a plasma processing end point, and corresponding to one of the types and being stored in advance in a data storage unit;

an end point detection step of detecting an end point of the plasma processing based on the setting data set selected in the selection step; and a termination step of terminating the plasma processing at the end point detected in the end point detection step.

2. The plasma processing method of claim 1, wherein the optical data detection unit includes:

a light source for irradiating a light onto the substrate; and an optical detection unit for detecting optical spectrum data of a reflected light, the reflected light being obtained when the light irradiated from the light source is reflected from the substrate.

3. The plasma processing method of claim 2, wherein the optical data for determining the type of the substrate is optical spectrum data detected by the optical data detection unit in a predetermined time after initiating the plasma processing on the substrate.

4. The plasma processing method of claim 3, wherein each of the type of the substrate is classified based on the type of the mask formed on the film to be processed as an object to be plasma-processed, and wherein the end point detection step includes detecting a film thickness of the film to be processed on the substrate based on the optical spectrum data detected by the optical data detection unit at a predetermined time while processing the substrate, and determining a time when the film thickness reaches a predetermined film thickness as the end point of the plasma processing.

5. The plasma processing method of claim 1, wherein each of the setting data sets is an end point detection method or an end point detection recipe corresponding to one of the types.

6. The plasma processing method of claim 1, wherein a partial least squares method is used as the multivariate analysis in the analysis step.

7. A plasma processing method for generating a plasma of a processing gas by applying a high frequency power to an electrode provided in a processing chamber and processing a substrate using the plasma, the plasma processing method comprising:

an analysis step of obtaining, by using a multivariate analysis, a correlation between type data set corresponding to a plurality of types classified based on a type of a mask pattern formed on a film to be processed disposed on the substrate and optical data to be detected by an optical data detection unit when plasma-processing on the substrate;

a determining step of obtaining, based on the correlation obtained in the analysis step, type data from optical data detected by the optical data detection unit when initiating a plasma processing on the substrate, and determining a type of the substrate by using the obtained type data, the type of the substrate corresponding to the type of the mask pattern formed on the film to be processed on the substrate;

a selection step of selecting a recipe setting data set corresponding to the type of the substrate determined in the determining step from recipe setting data sets, each of the recipe setting data sets serving to detect a plasma processing end point, and corresponding to one of the types and being stored in advance in a data storage unit;

an end point detection step of detecting an end point of the plasma processing based on the recipe setting data set selected in the selection step; and a termination step of terminating the plasma processing at the end point detected in the end point detection step.

8. The plasma processing method of claim 7, wherein the optical data detection unit includes:

a light source for irradiating a light onto the substrate; and an optical detection unit for detecting optical spectrum data of a reflected light, the reflected light being obtained when light irradiated from the light source is reflected from the substrate.

9. The plasma processing method of claim 8, wherein each of the type of the substrate is classified based on an aperture ratio within a region in a mask on the substrate.

10. The plasma processing method of claim 9, wherein each of the recipe setting data sets corresponds to one of film thickness data sets, each representing a correlation between the optical data and a film thickness, and wherein the selection step includes selecting film thickness data corresponding to the type of the substrate determined in the determining step, and the end point detection step includes detecting, based on the film thickness data selected in the selection step, a film thickness of the film to be processed on the substrate from the optical spectrum data detected by the optical data detection unit at a predetermined time while processing the substrate, and determining a time when the film thickness reaches a predetermined film thickness as the end point of the plasma processing.

11. A plasma processing method for generating a plasma of a processing gas by applying a high frequency power to an electrode provided in a processing chamber and processing a substrate using the plasma, the plasma processing method comprising:

an analysis step of obtaining, by using a multivariate analysis, a correlation between type data set corresponding to a plurality of types classified based on a type of a material of a mask on a film to be processed disposed on the substrate and optical data to be detected by an optical data detection unit when plasma-processing the substrate;

a determining step of obtaining, based on the correlation obtained in the analysis step, type data from optical data detected by the optical data detection unit when initiating a plasma processing on the substrate, and determining a type of the substrate by using the obtained type data, the type of the substrate corresponding to the type of the material of the mask on the film to be processed on the substrate;

a selection step of selecting a detection method setting data set corresponding to the type of the substrate determined in the determining step from detection method setting data sets, each of the detection method setting data sets serving to detect a plasma processing end point, and corresponding to one of the types and being stored in advance in a data storage unit;

an end point detection step of detecting an end point of the plasma processing based on the detection method setting data set selected in the selection step; and a termination step of terminating the plasma processing at the end point detected in the end point detection step.

12. The plasma processing method of claim 11, wherein the optical data detection unit includes:

a light source for irradiating a light onto the substrate; and an optical detection unit for detecting optical spectrum data of a reflected light, the reflected light being obtained when light irradiated from the light source is reflected from substrate.

13. The plasma processing method of claim 12, wherein each of the type of the substrate is classified based on whether a mask formed on the substrate is a hard mask or a photoresist mask.

14. The plasma processing method of claim 13, wherein a detection method setting data set for a type of the substrate on which the hard mask is formed is a setting data set for performing a method of detecting a film thickness of the film to be processed based on optical spectrum data of a reflected light from the substrate, the reflected light being obtained by irradiating an irradiation light having a single wavelength reflecting from the film to be processed, and detecting the end point based on the detected film thickness; and a detection method setting data set for a type of the substrate on which the photoresist mask is formed is a setting data set for performing a method of detecting a film thickness of the film based on optical spectrum data of a reflected light from the substrate, the reflected light being obtained by irradiating an irradiation light having a wavelength passing through the photoresist mask and a wavelength reflecting from the photoresist mask, and detecting the end point based on the detected film thickness.

* * * * *